United States Patent
Oikawa et al.

(10) Patent No.: US 8,034,470 B2
(45) Date of Patent: Oct. 11, 2011

(54) PERPENDICULAR MAGNETIC RECORDING MEDIUM AND METHOD OF MANUFACTURING THE MEDIUM

(75) Inventors: Tadaaki Oikawa, Kai (JP); Hiroyuki Uwazumi, Minami-Alps (JP)

(73) Assignee: Fuji Electric Co., Ltd. (JP)

( * ) Notice: Subject to any disclaimer, the term of this patent is extended or adjusted under 35 U.S.C. 154(b) by 415 days.

(21) Appl. No.: 12/048,253

(22) Filed: Mar. 14, 2008

(65) Prior Publication Data

US 2008/0226950 A1  Sep. 18, 2008

(30) Foreign Application Priority Data

Mar. 16, 2007  (JP) ................. 2007-067755

(51) Int. Cl.
G11B 5/667 (2006.01)
G11B 5/851 (2006.01)

(52) U.S. Cl. ............... 428/829; 428/832.1; 428/836.2; 428/836.3; 204/192.2

(58) Field of Classification Search .............. None
See application file for complete search history.

(56) References Cited

U.S. PATENT DOCUMENTS

| | | | |
|---|---|---|---|
| 5,543,221 A * | 8/1996 | Kitakami et al. | 428/332 |
| 5,833,770 A * | 11/1998 | Ominato et al. | 148/305 |
| 6,132,892 A * | 10/2000 | Yoshikawa et al. | 428/812 |
| 6,183,893 B1 | 2/2001 | Futamoto et al. | |
| 6,426,157 B1 | 7/2002 | Hokkyo et al. | |
| 7,311,983 B2 * | 12/2007 | Watanabe et al. | 428/829 |
| 7,498,092 B2 * | 3/2009 | Berger et al. | 428/829 |
| 2004/0184176 A1 | 9/2004 | Shimazaki et al. | |

(Continued)

FOREIGN PATENT DOCUMENTS

JP  61-89111 U  4/1988

(Continued)

OTHER PUBLICATIONS

JPO Abstract Translation of JP 05-251236 A (Pat-No. JP405251236A) (1993).*

(Continued)

*Primary Examiner* — Kevin Bernatz
(74) *Attorney, Agent, or Firm* — Rossi, Kimms & McDowell LLP

(57) ABSTRACT

A perpendicular magnetic recording medium is disclosed in which a soft magnetic layer used as a low $K_u$ layer can be stably produced with high performance. Thermal stabilization of magnetization, ease of writing by a magnetic head, and SNR also are improved. A method of manufacturing the medium is disclosed. The perpendicular magnetic recording medium includes at least a nonmagnetic underlayer, a magnetic recording layer, and a protective layer formed in this order on a nonmagnetic substrate. The magnetic recording layer includes a low $K_u$ layer having a relatively small perpendicular magnetic anisotropy constant ($K_u$ value), and a high $K_u$ layer in which the $K_u$ value is relatively large, and the low $K_u$ layer includes a soft magnetic thin film including an iron group element-based microcrystal structure, in which a nitrogen element is added to a ferromagnetic material mainly containing one of metals of Co, Ni and Fe or an alloy of the metal. The thin film has a crystal structure of a face-centered cubic lattice or hexagonal close packed, and a preferred crystal orientation plane parallel to a plane of the film is a (111) plane in the face-centered cubic lattice structure, and a (002) plane in the hexagonal close packed structure.

17 Claims, 3 Drawing Sheets

| | USED TARGET | SPUTTER GAS | $K_u$ [erg/cm$^3$] | CRYSTAL GRAIN SIZE [nm] |
|---|---|---|---|---|
| COMPARATIVE EXAMPLE 1 | 90mol%(70Co-20Cr-10Pt)-10mol%SiO$_2$ | pure Ar gas | $3.2 \times 10^6$ | 7.2 |
| COMPARATIVE EXAMPLE 2 | 90mol%(70Co-20Cr-10Pt)-10mol%SiO$_2$ | pure N$_2$ gas | $5.1 \times 10^3$ | — |
| EXAMPLE 1 | 90mol%(70Co-20Cr-10Pt)-10mol%SiO$_2$ | 90mol%Ar-10mol%N$_2$ | $1.2 \times 10^6$ | 6.4 |
| EXAMPLE 2 | 90mol%(70Co-20Cr-10Pt)-10mol%SiO$_2$ | 70mol%Ar-30mol%N$_2$ | $3.3 \times 10^5$ | 5.1 |
| EXAMPLE 3 | 90mol%(70Co-20Cr-10Pt)-10mol%SiO$_2$ | 50mol%Ar-50mol%N$_2$ | $6.6 \times 10^4$ | 3.8 |
| EXAMPLE 4 | 90mol%(70Co-20Cr-10Pt)-10mol%SiO$_2$ | 30mol%Ar-70mol%N$_2$ | $3.8 \times 10^4$ | 2.2 |

U.S. PATENT DOCUMENTS

| | | | |
|---|---|---|---|
| 2005/0181237 A1* | 8/2005 | Kitakami et al. | 428/832.1 |
| 2006/0177703 A1 | 8/2006 | Takenoiri et al. | |
| 2008/0131733 A1 | 6/2008 | Maeda | |
| 2009/0011283 A1* | 1/2009 | Girt et al. | 428/846 |

FOREIGN PATENT DOCUMENTS

| | | | |
|---|---|---|---|
| JP | 63086111 | | 4/1988 |
| JP | 05251236 A | * | 11/1993 |
| JP | 11186033 A | | 7/1999 |
| JP | 11-296833 A | | 10/1999 |
| JP | 2000-76636 A | | 3/2000 |
| JP | 2003-132532 A | | 5/2003 |
| JP | 2003-178416 A | | 6/2003 |
| JP | 2005-038569 A | | 2/2005 |
| JP | 2005-222675 A | | 8/2005 |
| JP | 2006-048900 A | | 2/2006 |
| JP | 2008-140460 A | | 6/2008 |

OTHER PUBLICATIONS

Shi, J., Piramanayagam, S., Chow, S., Wang, S., Zhao, J., and Mah, C., IEEE Trans. Mag., 42(10), Oct. 2006, 2369-2371.*

Australian Search Report issued in corresponding Singapore Patent Application 200708580-6 dated Mar. 20, 2009.

Notification of First Office Action issued in corresponding Chinese Patent Application No. 200710169925.9 dated Jul. 14, 2010.

Notification of Reasons for Refusal issued in corresponding Japanese Patent Application No. 2007-067755 dated Oct. 19, 2010. Partial English translation provided.

* cited by examiner

FIG. 2

| | USED TARGET | SPUTTER GAS | $K_U$ [erg/cm$^3$] | CRYSTAL GRAIN SIZE [nm] |
|---|---|---|---|---|
| COMPARATIVE EXAMPLE 1 | 90mol%(70Co-20Cr-10Pt)-10mol%SiO$_2$ | pure Ar gas | $3.2 \times 10^6$ | 7.2 |
| COMPARATIVE EXAMPLE 2 | 90mol%(70Co-20Cr-10Pt)-10mol%SiO$_2$ | pure N$_2$ gas | $5.1 \times 10^3$ | — |
| EXAMPLE 1 | 90mol%(70Co-20Cr-10Pt)-10mol%SiO$_2$ | 90mol%Ar-10mol%N$_2$ | $1.2 \times 10^6$ | 6.4 |
| EXAMPLE 2 | 90mol%(70Co-20Cr-10Pt)-10mol%SiO$_2$ | 70mol%Ar-30mol%N$_2$ | $3.3 \times 10^5$ | 5.1 |
| EXAMPLE 3 | 90mol%(70Co-20Cr-10Pt)-10mol%SiO$_2$ | 50mol%Ar-50mol%N$_2$ | $6.6 \times 10^4$ | 3.8 |
| EXAMPLE 4 | 90mol%(70Co-20Cr-10Pt)-10mol%SiO$_2$ | 30mol%Ar-70mol%N$_2$ | $3.8 \times 10^4$ | 2.2 |

FIG. 3

| USED TARGET | $K_u$ [erg/cm³] | O/W [dB] | SNR [dB] |
|---|---|---|---|
| COMPARATIVE EXAMPLE 3 | 90mol%(78Ni-18Fe-4Mo)-10mol%SiO$_2$ | $5.1 \times 10^4$ | 45 | 26.1 |
| EXAMPLE 3 | 90mol%(70Co-20Cr-10Pt)-10mol%SiO$_2$ | $6.6 \times 10^4$ | 42 | 27.3 |
| EXAMPLE 5 | 100mol%(70Co-20Cr-10Pt) | $8.2 \times 10^4$ | 40 | 26.4 |

_PERPENDICULAR MAGNETIC RECORDING MEDIUM AND METHOD OF MANUFACTURING THE MEDIUM_

CROSS REFERENCE TO RELATED APPLICATIONS

This application claims priority from Japanese application Serial No. JP 2007-067755, filed on Mar. 16, 2007, the contents of which are incorporated herein in their entirety by reference.

BACKGROUND OF THE INVENTION

A. Field of the Invention

The present invention relates to a perpendicular magnetic recording medium and a method of manufacturing the medium, and particularly relates to a perpendicular magnetic recording medium used for various magnetic recording devices including an external storage device for a computer, and a method of manufacturing the medium.

B. Description of the Related Art

As a technique for achieving an increase in recording density in magnetic recording, a perpendicular magnetic recording method is attracting attention as an alternative to the usual longitudinal magnetic recording method. This is because, compared with the usual longitudinal magnetic recording method, the perpendicular magnetic recording method has advantages of high density, high thermal stability, and sufficient writing capability even for a recording medium having high coercive force, making it possible to exceed a limit of recording density of the longitudinal magnetic recording method.

In a perpendicular magnetic recording medium, since information is recorded with a direction of magnetization being perpendicular to a film plane of a magnetic recording layer, magnetization needs to be kept stably in the direction perpendicular to the film plane. Therefore, a magnetic recording layer used for the perpendicular magnetic recording medium is required to have a high perpendicular magnetic anisotropy coefficient ($K_u$ value). The $K_u$ value of a magnetic recording layer of a perpendicular magnetic recording medium being currently studied is approximately $1 \times 10^6$ erg/cm$^3$ or more.

In magnetic grains having uniaxial magnetic anisotropy, magnitude of a magnetic field necessary for reversal of magnetization is called anisotropy field $H_k$, and $H_k$ is generally expressed as $H_k=2K_u/M_s$ in terms of saturation magnetization $M_s$, and the $K_u$ value. Therefore, to induce reversal of magnetization, a magnetic field of $H_k$ or more is required, and a value of the magnetic field is proportional to the $K_u$ value. In a magnetic recording medium, when $H_k$ is excessively high, reversal of magnetization becomes insufficient during writing by a magnetic head, and thus normal operation is disabled, therefore a moderate $H_k$ value is needed.

In a magnetic recording medium being an aggregate of magnetic grains, an average magnetization reversal field, of which the value is called coercive force $H_c$, is determined by distribution of the $H_k$ values and axes of easy magnetization of individual magnetic grains, and strength of magnetic interactions between the magnetic grains and the like. When the magnetic interactions between the magnetic grains are small, the $H_c$ value approaches the $H_k$ value.

Moreover, an energy barrier E necessary for magnetization reversal is expressed as $E=k_u V(1-H/H_k)^2$, where H is a magnetic field applied in a direction of the axis of easy magnetization, and V is volume of a grain. When the energy barrier E is not sufficiently high compared with thermal energy $k_B T$ ($k_B$ is Boltzmann constant, and T is the absolute temperature), magnetization is reversed due to an effect of the thermal energy. This is called thermal fluctuation (or thermal disturbance) of magnetization, and implies loss of information in the magnetic recording medium, therefore the $k_u V$ value, which determines the energy barrier E, needs to be kept relatively high. Even if thermal fluctuation of magnetization does not lead to loss of information, it surfaces as a medium noise called reverse magnetic domain noise due to partial reversal of a recorded bit.

Typically, $K_u V/k_B T$ is used as an index of the thermal fluctuation. However, this is used in cases where an external magnetic field is not being applied. When a magnetic field H is being applied, the index is expressed as $k_u V(1-H/H_k)^2/k_B T$ using the energy barrier E.

Furthermore, to reduce medium noises and thus improve quality of a recorded information signal by improving the signal-to-noise ratio (SNR), it is necessary to reduce a value of activation grain size $D=V/\delta$ (here, $\delta$ is thickness of a magnetic recording layer), i.e., to reduce a unit of reversal of magnetization. When the unit of magnetization reversal is small, a minute recording bit can be properly written, and consequently SNR is improved. Therefore, many studies have been made to reduce the D value in the perpendicular magnetic recording medium. To reduce the D value, it is effective to reduce crystal grain size of the magnetic recording layer, and reduce the magnetic interactions between crystal grains.

From the above, when the D value is reduced to improve SNR, the V value is reduced, therefore a high $k_u$ value is needed to keep a value of the energy barrier E necessary for stably keeping magnetization. On the other hand, when the $k_u$ value is kept high, the $H_k$ value is increased, i.e., a magnetic field necessary for magnetization reversal is increased. This leads to difficulty in writing of information by a magnetic head. Thus, in the magnetic recording medium, it is extremely difficult to satisfy all three factors of (1) improvement in SNR, (2) thermal stabilization of magnetization (decrease in reverse magnetic domain noise), and (3) ease of writing by the magnetic head, which are in a tradeoff relationship with respect to one another.

As a perpendicular magnetic recording medium aiming to compatibly achieve improvement in SNR and thermal stabilization of magnetization among the three factors, a perpendicular magnetic recording medium has been proposed. The medium has a magnetic recording layer of a so-called functionally separated type in which a plurality of magnetic recording layers having different $K_u$ values are stacked (see, for example, JP-A-11-296833 (U.S. Pat. No. 6,183,893 as U.S. counterpart patent), and JP-A-2000-76636 (U.S. Pat. No. 6,426,157 as U.S. counterpart patent).

In JP-A-11-296833 (U.S. Pat. No. 6,183,893 as U.S. counterpart patent), it is disclosed that a medium which is high with respect to thermal stability of magnetization and excellent in SNR can be produced by stacking a layer of a region having a high $K_u$ value so that thermal stability of magnetization is high (upper layer), and a layer of a region having a somewhat low $K_u$ value so that magnetic interactions between crystal grains are small and therefore SNR is high (lower layer). In one aspect, it is disclosed that the $K_u$ value of the upper layer is adjusted to be $2.5 \times 10^6$ erg/cm$^3$ to $5 \times 10^6$ erg/cm$^3$, and the $K_u$ value of the lower layer is adjusted to be $1 \times 10^6$ erg/cm$^3$ to $2.5 \times 10^6$ erg/cm$^3$. In JP-A-2000-76636 (U.S. Pat. No. 6,426,157 as U.S. counterpart patent), a similar technical idea is disclosed. Thus, it is disclosed that similar effects are obtained by stacking magnetic recording layers having different $K_u$ values and crystal orientations. However, while JP-A-11-296833 (U.S. Pat. No. 6,183,893 as U.S. counterpart patent) and JP-A-2000-76636 (U.S. Pat. No. 6,426,157 as U.S. counterpart patent) disclose compatibly achieving improvement in SNR and thermal stabilization of magnetization, they make no consideration on ease of writing by the magnetic head.

With increase in recording density, the demand for reducing the D value and keeping the $K_u$ value high in a medium has increased more and more, in order to stably keep a small recording bit. In such a medium, it is extremely important to secure ease of writing by the magnetic head.

In view of the above, the inventors applied an invention described in JP-A-2005-222675 (US2005/0181237A1 as US counterpart laid-open patent) aiming to provide a perpendicular magnetic recording medium in which thermal stabilization of magnetization and ease of writing by the magnetic head were compatibly achieved, and SNR also was improved. A summary of the invention described in JP-A-2005-222675 (US2005/0181237A1 as US counterpart laid-open patent) is as follows. That is, a perpendicular magnetic recording medium includes at least a nonmagnetic underlayer, a magnetic recording layer, and a protective layer formed in this order on a nonmagnetic substance, wherein the magnetic recording layer includes a low $K_u$ layer having a perpendicular magnetic anisotropy constant ($K_u$ value) of $1 \times 10^5$ erg/cm$^3$ or less, and a high $K_u$ layer having the $K_u$ value of $1 \times 10^6$ erg/cm$^3$ or more, i.e., the high and low $K_u$ values differ at least ten fold. According to such a configuration, thermal stabilization of magnetization and ease of writing by the magnetic head can be compatibly achieved. Such operation is described as follows. In the magnetic recording layer in a two-layer structure including the low $K_u$ layer and the high $K_u$ layer, it is assumed that magnetic coupling of magnetization occurs in a thickness direction, and simultaneous magnetization reversal is thus induced. When a $K_u$ value of the low $K_u$ layer is ignored as an approximation, the total $K_u$ value of the stacked films is decreased in accordance with increase in thickness, however, since the $M_s$ value is kept even in the low $K_u$ region, the total $M_s$ value of the films is not significantly changed. Consequently, as is clear from the above relationship $H_k = 2K_u/M_s$ that the $H_k$ value is effectively decreased, and reversal of magnetization is easily induced.

On the other hand, when the energy barrier $E = k_u V(1 - H/H_k)^2$ is taken into consideration, since the V value can be regarded as the total volume of the films, the total $K_u V$ value of the stacked films is larger than a $K_u V$ value in the case of only the high $K_u$ region. Here, since the $H_k$ value is decreased as above, the decrease in energy barrier can be controlled at a small level, provided the externally applied magnetic field H is relatively low. That is, a medium is easily produced in which thermal stabilization of magnetization and ease of writing by the magnetic head are compatibly achieved.

According to the invention described in JP-A-2005-222675 (US2005/0181237A1 as US counterpart laid-open patent), a perpendicular magnetic recording medium can be provided in which thermal stabilization of magnetization and ease of writing by the magnetic head, particularly an overwrite characteristic described later, are improved, and furthermore SNR is improved. Overwrite is writing a new signal over an originally recorded signal without erasing the originally recorded signal. In a magnetic recording device, when data are overwritten, if the original data are not fully replaced by new data, an error may occur. The overwrite characteristic generally means a ratio of decay of an original signal when the original signal is overwritten with a subsequent signal, which represents overwrite performance.

Among patent documents, JP-A-2003-132532 and JP-A-2003-178416 are described while being compared with an embodiment of the invention in the section of Summary of the Invention.

The present invention is directed to overcoming or at least reducing the effects of one or more of the problems set forth above.

SUMMARY OF THE INVENTION

An important point in the perpendicular magnetic recording medium as described in the JP-A-2005-222675 (US2005/0181237A1 as US counterpart laid-open patent) is that the stacked, two recording layers are accurately controlled in physical property values (perpendicular magnetic anisotropy $K_u$ and saturation magnetization $M_s$) of the high $K_u$ layer and the low $K_u$ layer. In the high $K_u$ layer, the physical property values can be appropriately adjusted using a composition or a layer configuration. On the other hand, in a soft magnetic layer used as the low $K_u$ layer, since a soft magnetic property of the layer is significantly changed not only by the composition or the layer configuration, but also by the crystal grain size or distortion in the crystals, which may change depending on the deposition process, the physical property values are difficult to control. Moreover, it is important to reduce a value of the activation grain size D in order to obtain a sufficient medium characteristic.

The invention was made in view of the above points, and an object of the invention is to provide a perpendicular magnetic recording medium in which the soft magnetic layer used as the low $K_u$ layer can be stably produced with high performance, and thermal stabilization of magnetization, ease of writing by the magnetic head, and SNR are further improved, and to provide a method of manufacturing the medium.

The object is attained according to the following. A perpendicular magnetic recording medium includes at least a nonmagnetic underlayer, a magnetic recording layer, and a protective layer formed in this order on a nonmagnetic substrate; wherein the magnetic recording layer includes a low $K_u$ layer having a relatively small perpendicular magnetic anisotropy constant ($K_u$ value), and a high $K_u$ layer of which the $K_u$ value is relatively large, and the low $K_u$ layer includes a soft magnetic thin film including an iron-group-element based microcrystal structure, in which a nitrogen element is added to a ferromagnetic material mainly containing one of the metals of Co, Ni and Fe, or an alloy of the metal, the thin film having a crystal structure of a face-centered cubic lattice or hexagonal close packed, and a preferred crystal orientation plane parallel to a plane of the film is made to be a (111) plane in the face-centered cubic lattice structure, and a (002) plane in the hexagonal close packed structure.

In a preferred embodiment, the magnetic recording layer includes a low $K_u$ layer having the $K_u$ value of $1 \times 10^5$ erg/cm$^3$ or less, and a high $K_u$ layer having the $K_u$ value of $1 \times 10^6$ erg/cm$^3$ or more. In another preferred embodiment, the low $K_u$ layer includes crystal grains including ferromagnetic metal, and nonmagnetic grain boundaries for magnetically separating the crystal grains from one another, and the nonmagnetic grain boundaries contain a nonmagnetic oxide as a main component. According to a further preferred embodiment, the high $K_u$ layer includes an alloy thin film that contains Co as a main component, and includes at least Pt, and has a crystal structure that is hexagonal close packed, and a preferred crystal orientation plane parallel to a plane of the film is made to be the (002) plane. In another embodiment, the high $K_u$ layer includes crystal grains that include ferromagnetic metal, and nonmagnetic grain boundaries for magnetically separating the crystal grains from one another, and the nonmagnetic grain boundaries contain a nonmagnetic oxide as a main component. In yet another embodiment, a ratio of a saturation magnetization value (M, value) of the low $K_u$ layer to an $M_s$ value of the high $K_u$ layer is adjusted to be 0.8 to 1.2.

In a method of manufacturing the perpendicular magnetic recording medium, the low $K_u$ layer is formed by sputtering a material exhibiting ferromagnetism using a sputter gas containing a gas material including a nitrogen compound.

Next, operation and effects of the above-described media and method are described. Differences from inventions described in JP-A-2003-132532 and JP-A-2003-178416, which disclose techniques comparatively similar to the technique of an embodiment of the invention, are described together. According to the present invention, as described in detail later, physical property values such as $K_u$ and $M_s$ of a soft magnetic layer used as the low $K_u$ layer can be controlled by the amount of nitrogen to be added. In addition, crystal grain size (activation grain size) can be reduced with respect to the amount of nitrogen to be added. Such operation is described below.

In a magnetic recording medium, a soft magnetic film including an FeNi based alloy (permalloy) or FeAlSi based alloy (sendust) is usually used for a material for a magnetic recording head, and recently, in the perpendicular magnetic recording medium, a soft magnetic film as a backing layer is used between the substrate and the magnetic recording film to efficiently perform recoding and reproduction at high density.

Hereinafter, typical soft magnetic materials are described:

[1] FeNi based alloy formed by vacuum deposition or electroplating.

[2] FeAlSi based alloy formed by vacuum deposition.

[3] A soft magnetic film including iron group element-based microcrystal structure in which a ferromagnetic material (iron, nickel, or cobalt) is added with a metalloid element represented by carbon (C), silicon (Si), boron (B), nitrogen (N), and phosphorous (P) (see JP-A-2003-132532).

[4] A soft magnetic film including a soft magnetic material (CoZr based alloy) added with nitrogen (N) (see JP-A-2003-178416).

[5] A soft magnetic film including a granular structure such as FeAlO.

[6] A soft magnetic film including a stacked structure such as Fe/C or $Fe/SiO_2$.

JP-A-2003-132532 discloses that a soft magnetic film is formed by sputtering a material exhibiting ferromagnetism using a sputter gas containing a gas material including a compound of hydrogen and a metalloid element. JP-A-2003-178416 discloses that a low-noise perpendicular magnetic recording medium is obtained by depositing a soft magnetic layer containing nitrogen between a substrate and a magnetic recording layer by a reactive sputtering method using a mixed gas of argon and nitrogen.

As described later, the material used for the soft magnetic film for the low $K_u$ layer of an embodiment of the invention belongs to the above [3], which is formed by sputtering a ferromagnetic material mainly containing one of the metals Co, Ni or Fe, or an alloy of the metal, using a sputter gas containing a gas material that includes a nitrogen compound. While the ferromagnetic material used in an embodiment of the invention is similar to that of the invention of JP-A-2003-132532, since an embodiment of the invention is considered to be apparently most similar to JP-A-2003-178416 in that a soft magnetic layer with added nitrogen is deposited, differences between an embodiment of the invention and the invention of JP-A-2003-178416 are described below, and consequently operation and effects of an embodiment of the invention are described in detail.

While the structure of the layer is intentionally made amorphous in the soft magnetic layer of JP-A-2003-178416, the soft magnetic layer of an embodiment of the invention is basically different in a point of having a crystal structure. In an embodiment of the invention, since the low $K_u$ layer as the soft magnetic layer also takes part of magnetization reversal as a magnetic recording layer, the layer has a crystal structure (face-centered cubic structure or hexagonal close packed structure) as a precondition. In the amorphous structure in JP-A-2003-178416, such control of magnetization reversal cannot be performed.

The basic difference is essentially due to a fact that objective functions are completely different between the soft magnetic layer (low $K_u$ layer) of an embodiment of the invention and the soft magnetic layer (soft magnetic backing layer) of JP-A-2003-178416. A function required for the soft magnetic backing layer used in JP-A-2003-178416 is to effectively concentrate recording fluxes from a recording section of a head in a direction of the recording layer during recording. Moreover, a direction of magnetization in the soft magnetic backing layer is in an in-plane direction of a substrate, therefore the head and the soft magnetic backing layer are made to be in a kind of magnetic circuit. Such a magnetic backing layer is provided in a perpendicular magnetic recording medium so as to take roles of improving recording resolution and increasing reproduction output.

On the contrary, the low $K_u$ layer of an embodiment of the invention is completely different from the soft magnetic backing layer, and functions as a recording layer that actually records information in conjunction with the high $K_u$ layer. Moreover, a direction of magnetization of the low $K_u$ layer, which is important for the perpendicular magnetic recording medium, is in a direction perpendicular to a film plane, and in this regard, the low $K_u$ layer is significantly different from that of the soft magnetic backing layer.

Next, as a difference between an embodiment of the invention and the invention of JP-A-2003-178416, a difference in the reason why nitrogen addition is effective is described. The reason why nitrogen addition is effective in the invention of JP-A-2003-178416 is, to quote description of the paragraph [0012] of the specification of JP-A-2003-178416, that nitrogen is introduced into the soft magnetic layer and exchange coupling force between grains in the soft magnetic layer is reduced, resulting in stabilization of a Neel wall, that is, control of the exchange coupling force is achieved. On the contrary, a purpose of adding nitrogen in an embodiment of the invention is to induce a soft magnetic property due to reduction in crystal grain size in accordance with an increase in the amount of nitrogen to be added. Specifically, when a film is formed by a sputter method, N is added to a sputter gas such as Ar, thereby to reduce crystal grain size of a film to be formed.

On the other hand, when crystal grain size (D) of a ferromagnetic material is gradually reduced, coercive force is initially increased in reverse proportion to D, however, when D is decreased to a certain size (about 40 nm in α-Fe) or less, coercive force is conversely decreased abruptly in proportion to $D^6$. The reason for this phenomenon is considered to be that crystal magnetic anisotropy is averaged due to exchange interactions exerted between nanocrystalline grains, and thereby the anisotropy is apparently reduced. By using this operation, even if a material having a comparatively large crystal magnetic anisotropy such as α-Fe is given, an excellent soft magnetic property can be achieved. Moreover, since a perpendicular magnetic anisotropy constant ($k_u$ value) and a saturation magnetization $M_s$ value are decreased approximately linearly to the amount of nitrogen to be added, each of the values can be controlled by optimizing the amount of nitrogen to be added.

In JP-A-2003-178416, "control of perpendicular magnetic anisotropy by adding nitrogen" refers to controlling a magnetic wall structure, namely, suppressing generation of perpendicular magnetic anisotropy. However, in an embodiment of the invention, since the soft magnetic layer takes part in magnetization reversal as a recording layer, the layer essentially has a crystal structure. Thus, "control of perpendicular magnetic anisotropy by adding nitrogen" refers to performing control such that the layer always has perpendicular magnetic anisotropy in a certain direction, and the control in terms of nitrogen addition is not for suppressing generation of perpendicular magnetic anisotropy.

Furthermore, as described before, the purpose of providing the soft magnetic layer is essentially different between the invention of JP-A-2003-178416 and an embodiment of the invention. That is, since the former uses a soft magnetic layer as the soft magnetic backing layer, and the latter uses the layer as a part of the recording layer (low $K_u$ layer), the desired thickness differs. The soft magnetic backing layer used in JP-A-2003-178416 needs to have a somewhat larger thickness, because it is provided to contribute to improving recording resolution, and increasing reproduction output as described before. Specifically, as described in the paragraph [0017] In JP-A-2003-178416, thickness of the soft magnetic layer is preferably 50 nm or more, more preferably 80 nm or more, and particularly preferably 100 nm or more.

On the contrary, in an embodiment of the invention, a case that total thickness of the magnetic recording layer is 30 nm or more is not appropriate, because simultaneous magnetization reversal is difficult to induce in a thickness direction, as described later. Furthermore, the total thickness of the magnetic recording layer is desirably small, 15 nm or less, in order to efficiently apply a magnetic field generated from a magnetic head to the layer. That is, thickness of the soft magnetic layer (low $K_u$ layer) used in an embodiment of the invention is 30 nm or less, and preferably less than 50 nm at the maximum, which is the minimally necessary thickness for the soft magnetic backing layer.

As described above, according to (1), physical property values such as $K_u$ and $M_s$ of the soft magnetic layer used as the low $K_u$ layer can be controlled by the amount of nitrogen to be added. In addition, crystal grain size (activation grain size) can be reduced with respect to the amount of nitrogen to be added, further improvement in medium characteristic can be achieved, and the soft magnetic layer used as the low $K_u$ layer can be stably produced with high performance.

While operation and effects of the various embodiments described above are as described in JP-A-2005-222675 (US2005/0181237A1 as US counterpart laid-open patent), the points of them are as follows. The configuration for forming the nonmagnetic grain boundaries according to the above-described embodiment in which the low $K_u$ layer includes crystal grains including ferromagnetic metal, and nonmagnetic grain boundaries for magnetically separating the crystal grains from one another, where the nonmagnetic grain boundaries contain a nonmagnetic oxide as a main component, or the above-described embodiment in which the high $K_u$ layer includes crystal grains including ferromagnetic metal, and nonmagnetic grain boundaries for magnetically separating the crystal grains from one another, where the nonmagnetic grain boundaries contain a nonmagnetic oxide as a main component is preferable with respect to improving SNR. The configuration according to the above-described embodiment in which the high $K_u$ layer includes an alloy thin film that contains Co as a main component, and is added with at least Pt, and has a crystal structure of the hexagonal close packed, and a preferred crystal orientation plane parallel to a plane of the film is made to be the (002) plane is preferable for forming the high $K_u$ layer since high $K_u$ is obtained by appropriately adjusting a composition of the configuration or a layer configuration. Furthermore, in an embodiment of the invention, while a plurality of magnetic recording layers having different $K_u$ values are stacked to induce simultaneous magnetization reversal, when saturation magnetization $M_s$ values of respective magnetic recording layers are extremely different from one another, a leakage field is generated at an interface and acts as a demagnetizing field, thereby magnetization reversal tends to be induced more than necessary. From a viewpoint of preventing this, the above-described embodiment in which a ratio of a saturation magnetization value ($M_s$ value) of the low $K_u$ layer to an $M_s$ value of the high $K_u$ layer is adjusted to be 0.8 to 1.2 is preferable.

According to an embodiment of the invention, a perpendicular magnetic recording medium can be provided, in which the soft magnetic layer used as the low $K_u$ layer can be stably produced with high performance, and thermal stabilization of magnetization, ease of writing by the magnetic head, and SNR are further improved, and a method of manufacturing the medium can be provided.

BRIEF DESCRIPTION OF THE DRAWINGS

The foregoing advantages and features of the invention will become apparent upon reference to the following detailed description and the accompanying drawings, of which:

FIG. 2 is a diagram showing results of obtaining $K_u$ values and crystal grain size of low $K_u$ single-layer films in examples of an embodiment of the invention and comparative examples; and FIG. 3 is a diagram showing an evaluation result of an electromagnetic conversion characteristic in examples of an embodiment of the invention and comparative examples.

DETAILED DESCRIPTION OF SPECIFIC EMBODIMENTS

Figure 1:
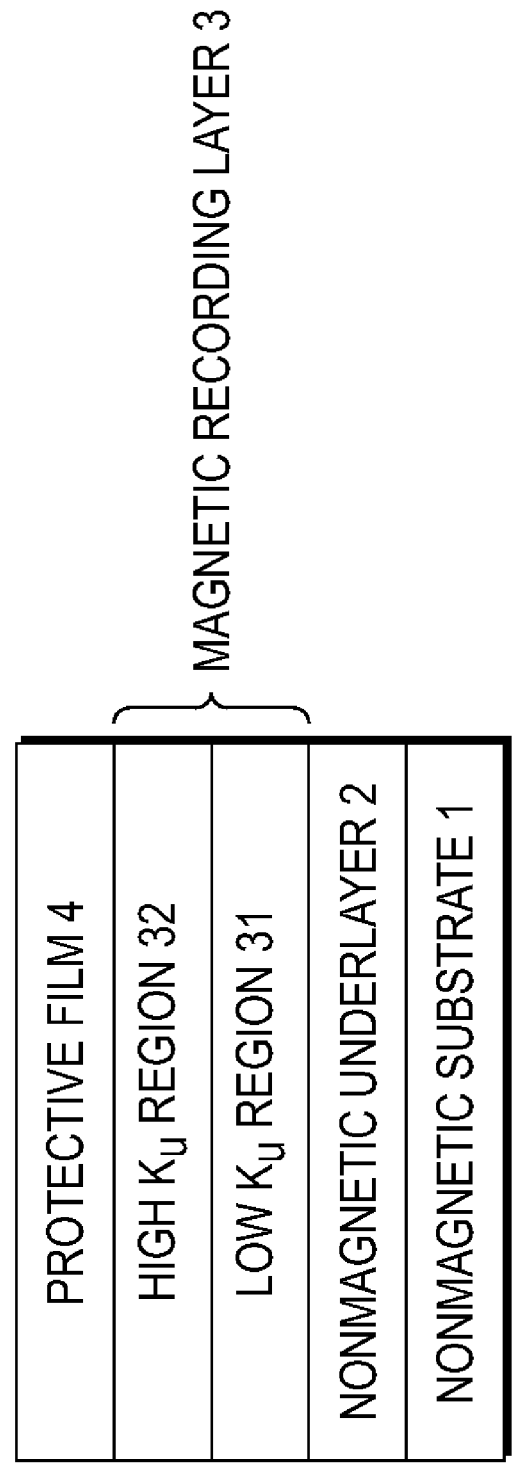
FIG. 1 is a schematic section diagram of a perpendicular magnetic recording medium according to an embodiment of the invention.

Next, an embodiment of the invention is described according to FIG. 1. FIG. 1 is a schematic section diagram of a perpendicular magnetic recording medium according to an embodiment of the invention.

The perpendicular magnetic recording medium of an embodiment of the invention as shown in FIG. 1 has a structure where at least nonmagnetic underlayer 2, magnetic recording layer 3, and protective film 4 as a protective layer are formed in this order on nonmagnetic substrate 1. Even if a seed layer or the like is added between nonmagnetic underlayer 2 and nonmagnetic substrate 1 for controlling crystal orientation or crystal grain size of nonmagnetic underlayer 2, an advantage of an embodiment of the invention is similarly exhibited. In addition, even if a comparatively thick (about several hundred nanometers) soft magnetic layer, which is typically called a backing layer, is added between nonmagnetic underlayer 2 and nonmagnetic substrate 1 for improving recording/reproduction sensitivity, the advantage is similarly exhibited. Furthermore, a liquid lubricant such as perfluoro polyether may be coated on protective film 4.

For nonmagnetic substrate 1, materials used for a typical magnetic recording medium can be used, such as Al alloy applied with NiP plating, chemical strengthening glass, and glass ceramics. Nonmagnetic underlayer 2 is used for appropriately controlling crystal grain size, grain boundary segregation structure, and crystal orientation of magnetic recording layer 3 formed thereon, and is not particularly restricted in terms of material or thickness. For example, a thin film about 3 nm to 30 nm in thickness can be used, which includes a Co alloy containing Cr of about 30 at % or more, or a metal such as Ti, Ru or Pt, or an alloy containing the metal. As protective film 4, for example, a thin film mainly containing carbon is used.

Next, magnetic recording layer 3 is described. As described before, magnetic recording layer 3 includes a layer of a low $K_u$ region 31 having a small perpendicular magnetic anisotropy constant ($K_u$ value), and a layer of a high $K_u$ region 32 in which the $K_u$ value is large. While a stacking order of the low $K_u$ region 31 and the high KU region 32 is not limited, it is desirable to stack low $K_u$ region 31 and high $K_u$ region 32 in this order on nonmagnetic underlayer 2 in order to efficiently apply a magnetic field generated from a magnetic head to high $K_u$ region 32, as shown in FIG. 1. Moreover, to obtain an excellent medium characteristic, it is particularly desirable that a $K_u$ value of the low $K_u$ layer is adjusted to be $1\times10^5$ erg/cm$^3$ or less, and a $K_u$ value of the high $K_u$ layer is adjusted to be $1\times10^6$ erg/cm$^3$ or more.

While thickness of each region is not particularly limited, a situation in which total thickness of the magnetic recording layer is 30 nm or more is not appropriate, because simultaneous magnetization reversal is difficult to induce in a thickness direction. Furthermore, total thickness of the magnetic recording layer is desirably small, 15 nm or less in order to efficiently apply the magnetic field generated from the magnetic head to the layer. Since ease of reversal of magnetization and a level of thermal stability of magnetization can be controlled by changing a thickness ratio between low $K_u$ region 31 and high $K_u$ region 32, the thickness ratio between them is desirably determined depending on a magnetic head to be used or temperature.

To obtain a perpendicular magnetic recording medium suitable for increase in recording density by using a layer configuration as above, it is desirable that an alloy thin film is used for high $K_u$ region 32, which mainly contains Co as described before, and is added with at least Pt, and has a crystal structure of the hexagonal close packed (hcp), and a preferred crystal orientation plane parallel to a plane of the film is a (002) plane.

Moreover, to improve SNR, there is a method of adding a nonmagnetic metal such as Cr, Ta, B or the like to accelerate formation of nonmagnetic grain boundaries in a CoPt based magnetic recording layer having the hcp structure. However, as described before, it is desirable to form nonmagnetic grain boundaries mainly containing an oxide in order to effectively reduce magnetic interactions between crystal grains to improve SNR. As the nonmagnetic oxide, known $SiO_2$, or $Cr_2O_3$, MgO, $ZrO_2$ or the like can be used.

The low $K_u$ region of an embodiment of the invention can be formed by sputtering a ferromagnetic material mainly containing one of metals of Co, Ni and Fe, or an alloy of the metal, using a sputter gas containing a gas material including a nitrogen compound. While the ferromagnetic material to be used is not particularly limited, for example, a material is preferably used which is an alloy including Co, Ni and Fe being added with Cr and Pt of 20 at % or less respectively, and Nb, Mo and Cu of 10 at % or less, respectively.

On the other hand, as the sputter gas used in sputtering such materials, a gas is used which includes a typically used gas of Ar (argon), Xe (xenon), or Kr (krypton), to which is added an approximate amount of nitrogen. Since the amount of nitrogen to be added differs depending on the ferromagnetic materials to be used, the amount is desirably determined for each of the ferromagnetic materials. Moreover, while a method of introducing the sputter gas is not particularly limited, it is desirable that the sputter gas is uniformly introduced into a vacuum deposition chamber.

Furthermore, the low $K_u$ layer includes a thin film of metal or alloy having a crystal structure of the face-centered cubic lattice (fcc) or hexagonal close packed (hcp), and a preferred crystal orientation plane parallel to a plane of the film preferably is made to be a (111) plane in the former, and a (002) plane in the latter. The (111) plane is oriented parallel to the film plane in the former, fcc structure, and the (002) plane is oriented in the latter, hcp structure, so that crystal orientation can be appropriately controlled when the magnetic recording layer as high $K_u$ region 32 is deposited on the low $K_u$ layer.

Here, since low $K_u$ region 31 formed according to the above method has added nitrogen, crystal grain size (activation grain size) is reduced compared with the low $K_u$ region of the invention described in the JP-A-2005-222675 (US2005/0181237A1 as US counterpart laid-open patent). Furthermore, the interactions between crystal grains are desirably reduced to improve SNR, and in this case, the nonmagnetic grain boundaries mainly containing the oxide are desirably formed.

In one embodiment of the invention, a plurality of magnetic recording layers which have different $K_u$ values are stacked to induce simultaneous magnetization reversal. However, when values of saturation magnetization $M_s$ of respective magnetic recording layers are extremely different from one another, a leakage flux is generated at an interface. Therefore, in order to prevent it, a ratio of the $M_s$ values of the layers is desirably adjusted to be within a range of 0.8 to 1.2.

EXAMPLES

Next, examples of the invention are described in conjunction with comparative examples according to FIGS. 1 to 3. First, Examples 1 to 4 and Comparative Examples 1 to 2 are described. In the description hereinafter, when pressure is represented in a unit of Torr, if the pressure is expressed in terms of Pa (Pascal) as the SI unit, the unit can be converted using 1 Torr=133 Pa (hereinafter, both units are substantially written). Moreover, while a magnetic field is sometimes represented in a unit of Oe (oersted), when the magnetic field is expressed in terms of A/m (ampere per meter) as the SI unit, the unit can be converted using 1 Oe=79.58 A/m. Furthermore, while the $K_u$ value is represented in a unit of erg/cm$^3$, when the value is expressed in terms of J/m$^3$ as the SI unit, the unit can be converted using 1 erg/cm$^3$ (erg/cc)=0.1 J/m$^3$.

Example 1

A 2.5 inch disk-shaped chemically-strengthened glass substrate was used for the nonmagnetic substrate. The substrate was washed and then introduced into a sputter apparatus. Then, a nonmagnetic underlayer including Ru 20 nm in thickness was formed on the substrate by a DC magnetron sputter method at Ar gas pressure of 2.66 Pa (20 mTorr). Next, a low $K_u$ layer was formed by an RF magnetron sputter method in which 90 mol % Ar-10 mol % $N_2$ was used for a sputter gas, Ar gas pressure during deposition was 0.67 Pa (5 mTorr), and a target of 90 mol % (70Co-20Cr-10Pt)-10 mol % $SiO_2$ (figures in parentheses show at %, likewise hereinafter) was used. While thickness of the low $K_u$ layer was not particularly limited, it was set to be 10 nm herein.

Subsequently, the high $K_u$ region was formed by a RF magnetron sputter method using a target of 90 mol % (85 Co-15 Pt)-10 mol % $SiO_2$ at Ar gas pressure of 0.67 Pa (5 mTorr). While thickness of the high $K_u$ layer was not particularly limited, it was fixed to 10 nm herein. Moreover, while thickness of each of other regions is not particularly limited, a situation in which total thickness of the magnetic recording layer is 30 nm or more is not appropriate, because simultaneous magnetization reversal is difficult to induce in the thickness direction, therefore the total thickness was set to be 30 nm or less. Furthermore, total thickness of the magnetic recording layer is desirably small, 15 nm or less, in order to efficiently apply a magnetic field generated from a magnetic head to the recording layer.

Subsequently, carbon protective layer 10 nm thick was stacked on the magnetic recording layer by a DC magnetron sputter method, and then the substrate was removed from a vacuum, consequently a magnetic recording medium in a configuration as shown in FIG. 1 was produced.

Example 2

A perpendicular magnetic recording medium was produced in the same way as in Example 1 except for using 70 mol % Ar-30 mol % $N_2$ for the sputter gas in forming the low $K_u$ region.

Example 3

A perpendicular magnetic recording medium was produced in the same way as in Example 1 except for using 50 mol % Ar-50 mol % $N_2$ for the sputter gas in forming the low $K_u$ region.

Example 4

A perpendicular magnetic recording medium was produced in the same way as in Example 1 except for using 30 mol % Ar-70 mol % $N_2$ for the sputter gas in forming the low $K_u$ region.

Comparative Example 1

A perpendicular magnetic recording medium was produced in the same way as in Example 1 except for using pure-Ar for the sputter gas in forming the low $K_u$ region.

Comparative Example 2

A perpendicular magnetic recording medium was produced in the same way as in Example 1 except for using pure-$N_2$ for the sputter gas in forming the low $K_u$ region.

FIG. 2 shows a result of obtaining the $K_u$ values of single low-$K_u$-layer films being 10 nm in thickness respectively by correcting demagnetizing field energy using a magnetic torque meter, the films having been formed according to the production methods described in Examples 1 to 4 and Comparative Examples 1 to 2, and a result of measuring crystal grain size of the single-layer films. According to FIG. 2, in Comparative Example 1 using pure Argon to form the low $K_u$ layer, since a film formed as the low $K_u$ layer is a ferromagnetic film, coercive force Hc of the single-layer medium is extremely large, 7.2 kOe. In addition, a $K_u$ value of the medium is large, $3.2 \times 10^6$ erg/cm$^3$.

On the other hand, in the Examples 1 to 4 and Comparative Example 2, with increase in amount of nitrogen added to the sputter gas a significant decrease in coercive force Hc was found in accordance with reduction in crystal grain size in the formed low $K_u$ layers. In particular, in Examples 2 to 4 and Comparative Example 2 using the sputter gas added with nitrogen of 70 mol % Ar-30 mol % $N_2$ or more, it was confirmed that the single-layer films had a soft magnetic property. On the other hand, the perpendicular magnetic anisotropy $K_u$ value is also decreased with increase in amount of nitrogen to be added as shown in FIG. 2, and for example, in Example 3 showing an excellent soft magnetic property, the $K_u$ value is $6.6 \times 10^4$ erg/cm$^3$, i.e., a desired $K_u$ value can be obtained.

However, in the materials used for the low $K_u$ layers herein, a single-layer film of Comparative Example 2, which was formed using pure nitrogen, was an amorphous film, and therefore orientation necessary for an embodiment of the invention was not able to be obtained. Therefore, "–" was shown in the column of crystal grain size of Comparative Example 2 in FIG. 2.

Regarding the crystal grain size, the size is 7.2 nm in Comparative Example 1 using only Ar gas as the sputter gas for film production. The crystal grain size decreased with increase in concentration of nitrogen to be added, and for example, a value of the crystal grain size is decreased to 3.8 nm in Example 3 using 50 mol % Ar-50 mol % $N_2$ for the sputter gas for film production.

As described above, the amount of nitrogen added to the sputter gas is controlled according to an embodiment of the invention, in order to control the $K_u$ value of the low $K_u$ layer. Since the change in $K_u$ value in response to the amount of nitrogen in the sputter gas differs depending on the composition of the ferromagnetic material used for forming the low $K_u$ layer, the amount of nitrogen to be added is preferably optimized for each of ferromagnetic materials to be used.

Next, evaluation of an electromagnetic conversion characteristic of the perpendicular media produced using an embodiment of the invention was carried out. A result of the evaluation is described according to FIG. 3. First, as a typical example of an embodiment of the invention, Example 3 was subjected to evaluation of the electromagnetic conversion characteristic. Moreover, Example 5 and Comparative Example 3 produced according to the following methods were similarly subjected to evaluation of the electromagnetic conversion characteristic. As the evaluation of the electromagnetic conversion characteristic, the overwrite characteristic and the ratio of signal to noise SNR were evaluated using a spin stand tester and a single pole type head (written track width 0.25 μm) for perpendicular magnetic recording, and a result of the evaluation is shown in FIG. 3. Overwrite values were evaluated in a manner of overwriting a 45 kFCI (kilo Flux Change per Inch) signal on a signal recorded at 336 kFCI. Furthermore, as values of SNR, values measured at 336 kFCI are shown. For each of the media that were subjected to evaluation of the electromagnetic conversion characteristic, a $K_u$ value of a single-layer film including only the low $K_u$ layer was also shown in FIG. 3.

Example 5

A perpendicular magnetic recording medium was produced in the same way as in Example 3 except that 100 mol % (70 Co-20 Cr-1 OPt), to which $SiO_2$ was not added, was used for a target material in forming the low $K_u$ region, in place of 90 mol % (70 Co-20 Cr-1 OPt)-10 mol % $SiO_2$ used in Example 3.

Comparative Example 3

A perpendicular magnetic recording medium was produced in the same way as in Example 3 except that 90 mol % (78 Ni-18 Fe-4 Mo)-10 mol % $SiO_2$, which was used for the material of the low $K_u$ layer of the perpendicular magnetic recording medium described in the above JP-A-2005-222675 (US2005/0181237A1 as US counterpart laid-open patent), was used for a target material in forming the low $K_u$ region.

According to FIG. 3, the $K_u$ value of the low $K_u$ single-layer film of each of the perpendicular media is $1\times10^5$ erg/cm$^3$ or less, i.e., a desired physical property value is obtained. Moreover, regarding the overwrite value (O/W), in reflection of improvement in ease of writing as a feature of the layer configuration of an embodiment of the invention, the value is 40 dB or more in any media, i.e., a practically sufficient value is given. On the other hand, regarding the SNR value, it is known that when Comparative Example 3 is compared to Example 3, while both include added $SiO_2$ to increase magnetic separation between crystal grains to improve SNR, in Example 3 as an embodiment of the invention, since the crystal grain size (activation grain size) is further reduced by adding the nitrogen element, the SNR value is improved by 1.2 dB compared with Comparative Example 3. Moreover, in Example 5, while the ferromagnetic material used for the low $K_u$ layer is not added with $SiO_2$, since the crystal grain size (activation grain size) is similarly reduced by adding the nitrogen element, the SNR value is improved by 0.3 dB compared with Comparative Example 3.

As described hereinbefore, according to an embodiment of the invention, a perpendicular magnetic recording medium can be produced, in which thermal stabilization of magnetization and ease of writing by the magnetic head are compatibly achieved, and furthermore SNR is improved. Moreover, for the soft magnetic layer used as the low $K_u$ layer of an embodiment of the invention, a ferromagnetic material of a metal of the iron group or an alloy including the metal is used, which is deposited in an atmosphere of the sputter gas added with nitrogen so as to have a soft magnetic property. Thus, the physical property values ($M_s$ and $K_u$ value) of the low $K_u$ layer can be controlled by the amount of added nitrogen gas, and the physical property values of the soft magnetic layer, which have been determined by a target material to be used, can be easily adjusted, and consequently a medium characteristic is easily adjusted. Moreover, since reduction in crystal grain size (activation grain size) can be concurrently achieved by adding nitrogen to the layer, improvement in SNR necessary for further increase in density can be achieved. Furthermore, since a material used for the high $K_u$ layer can be used for the low $K_u$ layer without any modification, productivity can be improved.

Thus, a perpendicular magnetic recording medium and method of manufacturing the medium has been described according to the present invention. Many modifications and variations may be made to the techniques and structures described and illustrated herein without departing from the spirit and scope of the invention. Accordingly, it should be understood that the media and methods described herein are illustrative only and are not limiting upon the scope of the invention.

What is claimed is:

1. A perpendicular magnetic recording medium, comprising at least a nonmagnetic underlayer, a magnetic recording layer, and a protective layer formed in this order on a nonmagnetic substrate,
wherein
the magnetic recording layer comprises a low Ku layer having a a Ku value$\leq 3.3\times10^5$, and a high Ku layer in which the Ku value is relatively large, and
the low Ku layer comprises a soft magnetic thin film in which nitrogen is added to a ferromagnetic material comprising Co, Cr, and Pt and a nonmagnetic oxide, the thin film having a crystal structure that is face-centered cubic lattice or hexagonal close packed lattice, with crystal orientation plane parallel to a plane of the thin film being a (111) plane in the case of a face-centered cubic lattice and a (002) plane in the case of a hexagonal close packed lattice.

2. The perpendicular magnetic recording medium according to claim 1, wherein the low Ku layer has a Ku value of $1\times10^5$ erg/cm$^3$ or less and the high Ku layer has a Ku value of $1\times10^6$ erg/cm$^3$ or more.

3. The perpendicular magnetic recording medium according to claim 1, wherein the low Ku layer includes crystal grains including ferromagnetic metal and nonmagnetic grain boundaries for magnetically separating the crystal grains from one another, and the nonmagnetic grain boundaries contain the nonmagnetic oxide as a main component.

4. The perpendicular magnetic recording medium according to claim 1, wherein the high Ku layer comprises an alloy thin film that contains Co as a main component to which at least Pt is added, has a hexagonal close packed lattice crystal structure, and has a (002) crystal orientation plane parallel to a plane of the film.

5. The perpendicular magnetic recording medium according to claim 1, wherein the high Ku layer comprises crystal grains including ferromagnetic metal and nonmagnetic grain boundaries for magnetically separating the crystal grains from one another, and the nonmagnetic grain boundaries contain a nonmagnetic oxide as a main component.

6. The perpendicular magnetic recording medium according to claim 1, wherein a ratio of a saturation magnetization value (Ms value) of the low Ku layer to an Ms value of the high Ku layer is 0.8 to 1.2.

7. A method of manufacturing the perpendicular magnetic recording medium according to claim 1, wherein the low Ku layer is formed by sputtering a material exhibiting ferromagnetism using a sputter gas containing a gas material including a nitrogen compound.

8. The perpendicular magnetic recording medium according to claim 1, wherein the microcrystal structure of the soft magnetic layer has a crystal structure of the iron group elements.

9. The perpendicular magnetic recording medium according to claim 1, wherein the low Ku layer is formed by sputtering a material exhibiting ferromagnetism using a sputter gas containing $N_2$.

10. The perpendicular magnetic recording medium according to claim 1, wherein the low Ku layer has a hexagonal close packed lattice crystal structure, with crystal orientation plane parallel to a plane of the thin film being a (002).

11. The perpendicular magnetic recording medium according to claim 1, wherein the low Ku layer has a face-centered cubic lattice close packed lattice crystal structure, with crystal orientation plane parallel to a plane of the thin film being a (111).

12. The perpendicular magnetic recording medium according to claim 1, wherein elemental nitrogen ($N_2$) is added to the ferromagnetic material.

13. A perpendicular magnetic recording medium, comprising at least a nonmagnetic underlayer, a magnetic recording layer, and a protective layer formed in this order on a nonmagnetic substrate,
wherein
the magnetic recording layer includes first and second Ku layers in which the first Ku layer has a perpendicular magnetic anisotropy constant (Ku value) that is smaller than the second Ku layer, and has an activation grain size$\leq$5.1 nm and
the first Ku layer comprises a soft magnetic thin film in which nitrogen is added to a ferromagnetic material which comprising Co, Cr, and Pt and a nonmagnetic oxide, the thin film having a crystal structure of a face-centered cubic lattice or hexagonal close packed lattice, with crystal orientation plane parallel to a plane of the thin film being a (111) plane in the case of a face-centered cubic lattice and a (002) plane in the case of a hexagonal close packed lattice.

14. A perpendicular magnetic recording medium according to claim 13, wherein Ku in the first Ku layer is at least 10 fold smaller than Ku in the second Ku layer.

15. The perpendicular magnetic recording medium according to claim 13, wherein elemental nitrogen ($N_2$) is added to the ferromagnetic material.

16. A perpendicular magnetic recording medium, comprising at least a nonmagnetic underlayer, a magnetic recording layer, and a protective layer formed in this order on a nonmagnetic substrate, wherein the magnetic recording layer comprises:

a low Ku layer comprising a soft magnetic thin film in which nitrogen is added to a ferromagnetic material comprising Co, Cr, and Pt and a nonmagnetic oxide, the thin film having a crystal structure that is face-centered cubic lattice or hexagonal close packed lattice, with crystal orientation plane parallel to a plane of the thin film being a (111) plane in the case of a face-centered cubic lattice and a (002) plane in the case of a hexagonal close packed lattice, the low Ku layer including crystal grains of a ferromagnetic metal and nonmagnetic grain boundaries for magnetically separating the crystal grains from one another, the nonmagnetic grain boundaries containing the nonmagnetic oxide as a main component, wherein the low Ku layer has a Ku value of $1\times10^5$ erg/cm$^3$ or less, and a high Ku layer comprising an alloy thin film that contains Co as a main component to which at least Pt is added, has a hexagonal close packed lattice crystal structure, has a (002) crystal orientation plane parallel to a plane of the film, and comprises crystal grains including ferromagnetic metal and nonmagnetic grain boundaries for magnetically separating the crystal grains from one another, the nonmagnetic grain boundaries containing a nonmagnetic oxide as a main component, wherein the high Ku layer has a Ku value of $1\times10^6$ erg/cm$^3$ or more.

17. The perpendicular magnetic recording medium according to claim 16, wherein elemental nitrogen ($N_2$) is added to the ferromagnetic material.

\* \* \* \* \*